United States Patent
Eslambolchi et al.

(10) Patent No.: US 7,463,034 B1
(45) Date of Patent: Dec. 9, 2008

(54) GROUND CONTROL UNIT FOR CABLE LOCATING

(75) Inventors: Hossein Eslambolchi, Los Altos Hills, CA (US); John Huffman, Conyers, GA (US); John K. Boland, Dover, DE (US); Claywell D. Turley, Covington, GA (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 11/804,256

(22) Filed: May 17, 2007

Related U.S. Application Data

(63) Continuation of application No. 11/289,996, filed on Nov. 30, 2005, now Pat. No. 7,235,960.

(51) Int. Cl.
*G01V 3/11* (2006.01)
(52) U.S. Cl. .............................. 324/326; 324/66; 324/67
(58) Field of Classification Search ............. 324/66–67, 324/326, 329, 330–332; 398/9–10, 12–13, 398/17, 19–20
See application file for complete search history.

(56) References Cited

U.S. PATENT DOCUMENTS

| | | | | |
|---|---|---|---|---|
| 5,363,094 A | * | 11/1994 | Staron et al. | 340/854.6 |
| 5,512,819 A | * | 4/1996 | Boudreaux | 324/66 |
| 6,700,380 B1 | * | 3/2004 | Eslambolchi et al. | 324/326 |

* cited by examiner

*Primary Examiner*—Bot LeDynh

(57) ABSTRACT

A system for selectively grounding each of a plurality of short-haul buried utility conveyances coupled to a common long-haul buried utility conveyance to enable a conveyance locating signal transmitted through the long-haul conveyance to travel from the long-haul utility conveyance to a selected short-haul utility conveyance. The system includes a first optical switch for selecting each of the plurality of short-haul utility conveyances to be grounded, where the first optical switch is adapted to receive an optical signal and selectively output the optical signal on one of a plurality of optical fibers; and a second optical switch coupled to each of the plurality of optical fibers for grounding each short-haul utility conveyance in response to the optical signal on a corresponding optical fiber.

13 Claims, 1 Drawing Sheet

GROUND CONTROL UNIT FOR CABLE LOCATING

CROSS-REFERENCE TO RELATED APPLICATIONS

This non-provisional application is a continuation and claims the benefit of U.S. application Ser. No. 11/289,996, filed Nov. 30, 2005, now U.S. Pat. No. 7,235,960.

BACKGROUND OF THE INVENTION

The present invention relates generally to locating an underground utility conveyance, and more particularly, to a method and apparatus for selectively locating a short-haul cable or pipe that is coupled to a long-haul (backbone) cable.

Many utilities, such as AT&T Corp., bury their pipes and cables ("utility conveyances") underground both for reasons of safety and esthetics. Underground burial often provides protection to such utility conveyances against weather and other sources of potential damage. Utilities that undertake burial of their conveyances usually make extensive efforts to plot the location of each buried conveyance on a map to facilitate its location in case of repair or replacement. While a map will indicate the general location of a buried conveyance, more precise location information often becomes necessary, particularly in urban environments. For that reason, most utilities that bury their conveyances underground typically rely on electromagnetic signaling techniques to precisely locate such conveyances.

U.S. Pat. No. 5,644,237 to Eslambolchi et al. (incorporated by reference herein) and assigned to the assignee of the present invention, discloses an electromagnetic signaling technique for locating a buried utility conveyance. A signal generator applies a locating signal and a confirmation signal to a metallic part of the conveyance. In the case of an optical fiber cable, the metallic part comprises either a metallic sheath or a copper trace wire within the cable. Using a signal detector, a technician detects both the locating signal and the confirmation signal radiated above ground to precisely locate the buried conveyance.

Conveyance location via electromagnetic signaling works well for long haul conveyances. However, some conveyance routes, and in particular, certain fiber cable routes in urban areas, include one or more short haul cables ("side-leg") cables that run between a long-haul (backbone) cable and a telecommunications facility. Each side leg cable connects the metallic sheath of the backbone cable to ground, thus allowing the locating signal on the backbone cable to pass into the side-leg cable. All other considerations being equal, a side-leg cable having a smaller impedance (i.e., a shorter signal path to the cable locating signal generator) will radiate a higher strength locating signal. Conversely, the side leg cable having a larger impedance (i.e., a longer signal path to the cable locating signal generator) will radiate a lower strength locating signal, making locating of such a side-leg cable more difficult. In the past, overcoming the problem of a low-strength locating signal on a side-leg cable required the addition of a separate locating signal generator for that side-leg. Such locating signal generators are expensive, and adding a separate locating signal generator for each side-leg will greatly increase costs.

U.S. Pat. No. 6,700,380 to Eslambolchi et al. (incorporated by reference herein) and assigned to the assignee of the present invention, discloses a method for selectively applying a conveyance-locating signal to each of a plurality of short haul (side leg) underground utility conveyances, each coupled to a backbone conveyance. In this expedient, a conveyance-locating signal generator applies a plurality of different frequency conveyance-locating signals to the backbone conveyance. A notch filter, comprising a part of a filter arrestor assembly, connects each short-haul conveyance to ground to selectively pass a particular frequency locating signal. In this manner, each short-haul conveyance carries a locating signal of a particular frequency having a strength that remains unaffected by locating signals on the other short-haul conveyances.

In view of the foregoing, there exists a need for a cable locating system and method that enables selective grounding of the short-haul conveyances to facilitate cable locating procedures without the need for a technician to physically travel to multiple locations to apply and remove the ground.

SUMMARY OF INVENTION

In accordance with an aspect of the present invention, a system is provided for selectively grounding each of a plurality of short-haul buried utility conveyances coupled to a common long-haul buried utility conveyance to enable a conveyance locating signal transmitted through the long-haul conveyance to travel from the long-haul utility conveyance to a selected short-haul utility conveyance. The system comprises a first optical switch. for selecting each of the plurality of short-haul utility conveyances to be grounded, where the first optical switch is adapted to receive an optical signal and selectively output the optical signal on one of a plurality of optical fibers; and a second optical switch coupled to each of the plurality of optical fibers for grounding each short-haul utility conveyance. The second optical switch is responsive to the optical signal on a corresponding optical fiber.

The inventive system provides the ability to remotely control all lateral ground points thereby eliminating the need for a technician to travel to each customer location and manually apply or remove the ground. This methodology reduces plant protection time and increases the efficiency of maintenance personnel at a dig location.

These and other advantages of the invention will be apparent to those of ordinary skill in the art by reference to the following detailed description and the accompanying drawings.

DETAILED DESCRIPTION OF THE PREFERRED EMBODIMENTS

Figure 1:
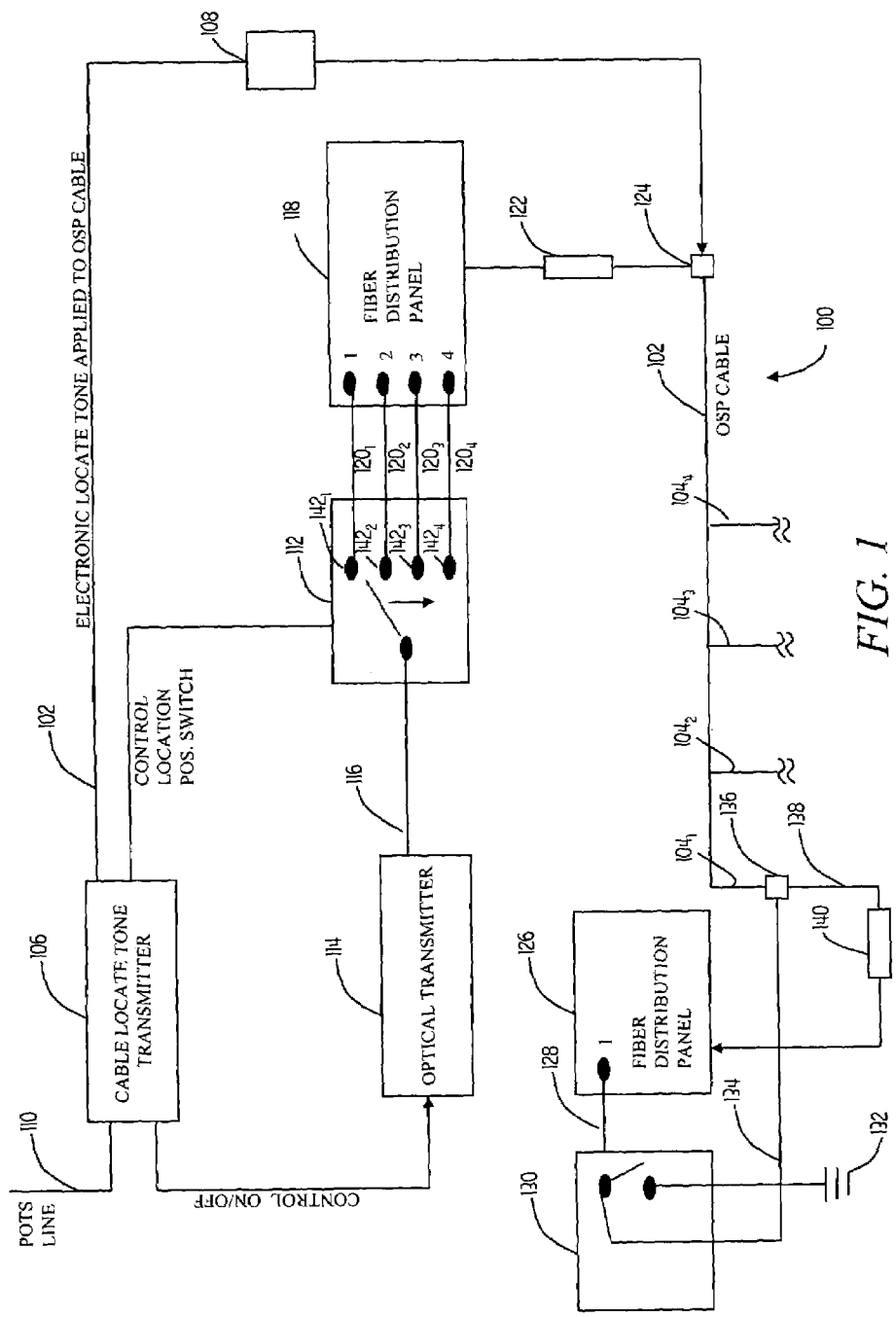
FIG. 1 is a schematic diagram of a grounding system in accordance with an aspect of the invention for selectively applying a locating tone to an isolated side-leg of a cable route.

FIG. 1 depicts a schematic diagram of an exemplary telecommunications system 100 that includes a long-haul (backbone) outside the plant (OSP) fiber optic cable 102 coupled to a plurality of short-haul side-leg cables $104_1$, $104_2$, $104_3$, and $104_4$ (collectively "side-legs 104"). The side-legs 104 each serve a respective customer location 1-4. The backbone cable 102 typically comprises a buried fiber optic cable that includes one or more individual optical fibers and a metallic sheath (not shown). The side-leg cables 104 each run from the backbone cable 102 to a separate telecommunications facility at the customer locations (not shown). The long-haul and short-haul cables are also referred to as utility conveyances as will be appreciated by those skilled in the art. Although four side-leg cables 104 are depicted in the illustrative drawing, the cable route could include a larger or smaller number of side-leg cables and corresponding customer locations.

To enable the location of each cable to be detected by an above-the-ground detector, a cable locate tone transmitter 106 generates and applies a cable locating tone to the sheath associated with backbone cable 102. This cable locating tone travels via relays 108 to each of the side-leg cables 104 via a bond between the sheath associated with backbone cable 102 and side-leg cables 104. The cable locate transmitter 106 may be, as in the exemplary embodiment, a LMS3 transmitter available from Telonix. The LMS3 transmitter generates a plurality of selectable low frequency tones that may be selected through a DTMF telephone interface, such as from POTS line 110 or from a cellular telephone or other interface (not shown). The locate tones may be remotely selected by frequency and the signal level can be adjusted as desired.

The cable tone transmitter 106 is also operably coupled to an optical switch 112 and an optical transmitter 114 for transmitting a source of light through an optical fiber 116 to the optical switch 112. These elements are also adapted for remote control via the DTMF, cellular or other interface. Optical switch 112 is connected to a fiber distribution panel 118 via a plurality of fiber jumpers $120_1$, $120_2$, $120_3$ and $120_4$. The fiber distribution panel 118 is coupled to backbone 102 via a splice enclosure 122 and ground closure 124. Each customer location has a fiber distribution panel (e.g., 126 associated with the first customer location) that receives a respective light signal (i.e., from fiber jumper $120_1$). Fiber distribution panel 126 is connected via a fiber jumper 128 to an optical switch 130 which is operable to open or close a ground connection 132 via ground wire 134. Side-leg $104_1$ is connected to ground wire 134 via ground enclosure 136. Fiber distribution panel 126 receives the control signal from fiber distribution panel 118 via a feeder fiber 138 through splice enclosure 140 as shown. When the multi-position optical switch 112 is selected to the first position at pole $142_1$, the optical control signal from source 114 is carried via the feeder fiber in the backbone 102 to the side-leg $104_1$ and ultimately to fiber distribution panel 126. This control signal closes optical switch 130 to enable the ground connection 132 at side-leg $104_1$. Switch 130 remains closed until the light source is removed (by changing the position of switch 112). In this manner, side-leg $104_1$ is selectively grounded as shown and described in the foregoing, and consequently the entire cable locating tone current flows through side-leg $104_1$ only.

The other side-legs $104_2$, $104_3$ and $104_4$ may be similarly grounded by moving optical switch 112 to close contacts $142_2$, $142_3$, and $142_4$, which will operate to close a switch coupled to a fiber distribution panel (similar to panel 126 but not shown) associated with each side-leg $104_2$, $104_3$ and $104_4$. Accordingly, each of side-legs $104_2$, $104_3$ and $104_4$ may be individually grounded to enable the entire cable locating tone current to flow through a selected side-leg.

The ability to remotely control all lateral ground points eliminates the need for a technician to travel to each customer location and manually apply or remove the ground. This methodology therefore reduces plant protection time and increases the efficiency of maintenance personnel at a dig location.

The present invention has been shown and described in what are considered to be the most practical and preferred embodiments. It is anticipated, however, that departures may be made therefrom and that obvious modifications will be implemented by those skilled in the art. It will be appreciated that those skilled in the art will be able to devise numerous arrangements and variations which, although not explicitly shown or described herein, embody the principles of the invention and are within their spirit and scope.

We claim:

1. A system for selectively grounding each of a plurality of buried short-haul utility conveyances coupled to a common buried long-haul utility conveyance to enable a conveyance locating signal transmitted through the buried long-haul conveyance to travel from the buried long-haul utility conveyance to a selected buried short-haul utility conveyance, comprising:

a first optical switch for selecting a buried short-haul utility conveyance to be grounded among the plurality of buried short-haul utility conveyances, the first optical switch adapted to output an optical control signal; and a second optical switch coupled to each buried short-haul utility conveyance for grounding each buried short-haul utility conveyance, the second optical switch being responsive to the optical control signal from the first optical switch.

2. The system recited in claim 1, wherein the first optical switch is coupled to an optical transmitter.

3. The system recited in claim 1, wherein the first optical switch is coupled to a cable locate tone transmitter.

4. The system recited in claim 1, wherein the first optical switch is remotely operated by DTMF control.

5. The system recited in claim 1, wherein the first optical switch is remotely operated by cellular control.

6. The system recited in claim 1, wherein the first optical switch is remotely operated over a network.

7. The system recited in claim 1, wherein the first optical switch is coupled to a cable locate transmitter, and is remotely operated over a network.

8. The system recited in claim 1, wherein the first optical switch is coupled to an optical transmitter and a cable locate tone transmitter.

9. A system for selectively grounding each of a plurality of buried short-haul utility conveyances coupled to a common buried long-haul utility conveyance to enable a conveyance locating signal transmitted through the buried long-haul conveyance to travel from the buried long-haul utility conveyance to a selected buried short-haul utility conveyance, comprising:

a first switch for selecting a buried short-haul utility conveyance to be grounded among the plurality of buried short-haul utility conveyances, the first switch adapted to selectively output a control signal on one of a plurality of fibers; and a second switch coupled to each of the plurality of fibers for grounding each buried short-haul utility conveyance, the second switch being responsive to the control signal on a corresponding fiber.

10. The system recited in claim 9, wherein the first switch is remotely operated by DTMF control.

11. The system recited in claim 9, wherein the first switch is remotely operated by cellular control.

12. The system recited in claim 9, wherein the first switch is remotely operated over a network.

13. The system recited in claim 9, wherein the first switch is coupled to a cable locate transmitter, and is remotely operated over a network.

* * * * *